(12) United States Patent
Audenaert et al.

(10) Patent No.: US 11,059,263 B2
(45) Date of Patent: Jul. 13, 2021

(54) METHOD FOR PRODUCING A COMPOSITE CONDUCTIVE MATERIAL AND COMPOSITE MATERIAL OBTAINED IN THIS WAY

(71) Applicant: Arkema France, Colombes (FR)

(72) Inventors: Marc Audenaert, Bernay (FR); Denis Huze, Fontaine Sous Jouy (FR)

(73) Assignee: ARKEMA FRANCE, Colombes (FR)

( * ) Notice: Subject to any disclaimer, the term of this patent is extended or adjusted under 35 U.S.C. 154(b) by 0 days.

(21) Appl. No.: 15/768,045

(22) PCT Filed: Oct. 13, 2016

(86) PCT No.: PCT/FR2016/052641
§ 371 (c)(1),
(2) Date: Apr. 13, 2018

(87) PCT Pub. No.: WO2017/064423
PCT Pub. Date: Apr. 20, 2017

(65) Prior Publication Data
US 2018/0304578 A1    Oct. 25, 2018

(30) Foreign Application Priority Data
Oct. 13, 2015   (FR) ..................................... 1559719

(51) Int. Cl.
| | | |
|---|---|---|
| *B32B 5/26* | (2006.01) | |
| *H01B 1/22* | (2006.01) | |
| *B32B 27/34* | (2006.01) | |
| *C08J 5/04* | (2006.01) | |
| *B64D 45/02* | (2006.01) | |
| *C08J 5/24* | (2006.01) | |
| *B32B 5/02* | (2006.01) | |
| *C08K 3/08* | (2006.01) | |
| *C23C 16/06* | (2006.01) | |

(52) U.S. Cl.
CPC ................ *B32B 5/26* (2013.01); *B32B 5/022* (2013.01); *B32B 5/024* (2013.01); *B32B 5/026* (2013.01); *B32B 27/34* (2013.01); *B64D 45/02* (2013.01); *C08J 5/042* (2013.01); *C08J 5/24* (2013.01); *H01B 1/22* (2013.01); *B32B 2262/02* (2013.01); *B32B 2262/101* (2013.01); *B32B 2262/106* (2013.01); *B32B 2262/14* (2013.01); *B32B 2264/0264* (2013.01); *B32B 2307/202* (2013.01); *B32B 2307/212* (2013.01); *B32B 2419/00* (2013.01); *B32B 2605/08* (2013.01); *B32B 2605/18* (2013.01); *C08J 2377/00* (2013.01); *C08K 2003/0806* (2013.01); *C23C 16/06* (2013.01)

(58) Field of Classification Search
None
See application file for complete search history.

(56) References Cited

U.S. PATENT DOCUMENTS

| | | | | |
|---|---|---|---|---|
| 3,708,387 | A * | 1/1973 | Turner | ..................... C08J 3/203 |
| | | | | 428/402 |
| 4,729,973 | A * | 3/1988 | Brockway | ............. C04B 35/119 |
| | | | | 264/6 |
| 5,489,449 | A * | 2/1996 | Umeya | ...................... B01J 8/42 |
| | | | | 427/213 |
| 5,614,320 | A * | 3/1997 | Beane | ...................... B01J 2/006 |
| | | | | 257/E23.112 |
| 5,835,841 | A * | 11/1998 | Yamada | ................ B22F 1/0096 |
| | | | | 428/546 |
| 5,965,064 | A | 10/1999 | Yamada et al. | |
| 6,315,945 | B1 * | 11/2001 | Macki | ....................... B22F 3/14 |
| | | | | 419/5 |
| 6,770,369 | B1 * | 8/2004 | Oyamada | ................. C23C 18/36 |
| | | | | 428/403 |
| 2006/0111470 | A1 * | 5/2006 | Takashima | .......... C23C 18/2086 |
| | | | | 523/210 |
| 2008/0102277 | A1 * | 5/2008 | Bae | ........................ H05K 3/323 |
| | | | | 428/403 |
| 2012/0270205 | A1 * | 10/2012 | Patel | .................... G01N 27/126 |
| | | | | 435/5 |
| 2012/0279781 | A1 | 11/2012 | Ozeki et al. | |

(Continued)

FOREIGN PATENT DOCUMENTS

| | | |
|---|---|---|
| CA | 2503159 | 4/2004 |
| EP | 2371529 A2 | 10/2011 |

OTHER PUBLICATIONS

Broduceanu, D. et al., "Fabrication of metal nanoparticle arrays by controlled decomposition of polymer particles," *Nanotechnology*, Feb. 5, 2013, pp. 1-7, vol. 24, No. 8.

(Continued)

*Primary Examiner* — Katie L. Hammer
(74) *Attorney, Agent, or Firm* — Saliwanchik, Lloyd & Eisenschenk

(57) ABSTRACT

The present invention relates to a method for producing a conductive composite material, as well as the composite material capable of being obtained by said method. The conductive material is obtained from a composite polymer matrix, which is formed by aggregation of composite conductive particles consisting of particles of a polymer matrix, having a diamter d50 of between 1 and 4000 μm, coated with a layer of electrically conductive material consisting of at least one metal. The ratio of the thickness of the conductive layer to the diameter d50 of the polymer matrix particles is between 0.0025:100 and 1.5:100, said thickness being less than 300 nm.

9 Claims, No Drawings

(56) References Cited

U.S. PATENT DOCUMENTS

2014/0018469 A1* 1/2014 Korzhenko ............ B82Y 30/00
523/201
2015/0079504 A1* 3/2015 Farrugia ............ G03G 9/09392
430/18

OTHER PUBLICATIONS

Hao, X. et al. "Development of the conductive polymer matrix composite with low concentration of the conductive filler" *Materials Chemistry and Physics*, 2008, pp. 15-19, vol. 109.
Qicheng, S. "Fluidized Bed Dip Coating of Powder Resin" *Plastics*, 1989, pp. 42-45, No. 2.
Renkui, H. "Engineering Materials and Heat Treatment" *Metallurgical Industry Press*, 2015, pp. 1-3.

* cited by examiner

METHOD FOR PRODUCING A COMPOSITE CONDUCTIVE MATERIAL AND COMPOSITE MATERIAL OBTAINED IN THIS WAY

CROSS-REFERENCE TO RELATED APPLICATION

This application is the U.S. national stage application of International Patent Application No. PCT/FR2016/052641, filed Oct. 13, 2016.

SUBJECT OF THE INVENTION

The present invention relates to a process for manufacturing a conductive composite material, and also to the composite material capable of being obtained according to this process.

BACKGROUND OF THE INVENTION

Polymer materials have a certain advantage in many applications, due to their lightness. Their mechanical properties may in addition be adjusted by incorporating therein various fillers and in particular reinforcing fibers such as carbon fibers. The composites obtained thus advantageously replace metals in many applications. Thus it is estimated that today composite materials represent more than 25% of the weight of the structure of an Airbus A380 where they have supplanted aluminum alloys.

However, the electrical conductivity of these composites based on carbon fibers is much lower than those of metals. Specifically, these fibers have the drawback of creating, within the material, a conductive pathway which is based on their orientation. This drawback is particularly pronounced in the context of the layered structures typically used in the aeronautical field, which have an insufficient ability to dissipate the electric current in the direction orthogonal to the planes of the plies of fibers, the electrical conductivity in this direction typically being close to that of the non-conductive polymer. Therefore, these structures do not sufficiently withstand lightning. Indeed, an airplane hit by lightning must be able to drain off and therefore conduct a current of the order of $10^5$ amperes, without excessively large potential differences appearing, which are capable of resulting in a delamination of the aforementioned composite structures and serious damage for the on-board electronic instruments. It is therefore necessary to improve the electrical conductivity of these structures so that it approaches those of copper or aluminum in the stacking direction of the plies.

To overcome the aforementioned drawbacks, it has been suggested to disperse conductive particles in the polymer matrix that is intended to impregnate the carbon fibers (EP 2 371 529 and EP 2 687 557). These conductive particles are intended to create electrical bridges on either side of the composite material obtained. They may be formed of a carbon-based material, such as carbon black, or of particles of glass or PMMA coated with a conductive metal. Besides the handling problems inherent to the use of nanofillers such as carbon black, these conductive particles are generally difficult to disperse homogeneously within a polymer matrix due to their difference in density with the molten polymer. Therefore it is understood that the inclusion of these particles within the polymer matrix may complicate the formulation of the latter. Moreover, the amounts of fillers needed to achieve the percolation threshold, beyond which the composite material is conductive, may negatively affect certain mechanical properties of the material.

Other polymer matrices that incorporate composite conductive particles of core-shell type are described in documents U.S. Pat. No. 5,965,064 and US 2012/279781. The publication by Brodoceanu et al. in *Nanotechnology*, vol. 24, no. 8 (Feb. 5, 2013) furthermore describes the use of conductive composite particles of core-shell type in the formulation of a conductive metal array.

The development of conductive composite materials based on polymers also has an advantage in industrial sectors other than aeronautics, and in particular in the manufacture of housings intended to protect electronic devices against electrostatic charges.

In the search for solutions that aim to render polymer matrices conductive, it has also been suggested to incorporate carbon nanotubes therein. These fillers have more marked dispersion problems compared to the conductive fillers discussed above, due to their entangled structure. Moreover, although the concentration of nanotubes needed to achieve the percolation threshold is lower than that of other fillers, the nanotubes have a tendency, at this concentration, to increase the viscosity of the matrix, which affects its flow properties, required for the processing thereof and limits, here too, its formulation.

It is possible to overcome the aforementioned dispersion problems and to increase the electrical conductivity of the composite material by applying carbon nanotubes or carbon black around polymer particles, in order to form conductive composite particles that will then be aggregated into a conductive composite material, rather than dispersing these fillers in a polymer matrix. A particular process has thus been proposed by Hao et al. in *Materials Chemistry and Physics*, vol. 109, 15-19 (2008) for the dry coating of polyethylene particles with carbon nanotubes (CNTs) or carbon black, which is carried out under conditions that lead to a softening of the polymer particles and to attachment of the fillers to their surface. The composite particles obtained are then compression molded to form plates.

Although it has certain advantages, this process does not make it possible to eliminate the problems of handling nanofillers and of the possible impact thereof on the environment. Therefore, there remains a need to provide an alternative process to the one described above.

SUMMARY OF THE INVENTION

In this context, the inventors have developed a process for manufacturing a composite material using polymer particles coated with metal, that does not require the dispersion of these particles in a polymer matrix. Although this process and the particles used have similarities with those described by Hao et al., they are distinguished therefrom by the fact that the composite particles of Hao et al. have a surface consisting of an aggregate of entangled CNTs or of agglomerated carbon black particles and not of a continuous film. The research carried out by the Applicant has made it possible to adjust the characteristics of the composite particles and the steps of the process according to invention, in order to make it possible to reconcile two a priori conflicting requirements for metallic composite particles, namely the use of a sufficient amount of metal to achieve the percolation threshold, without however preventing the coalescence of the polymer particles above the melting point. Moreover, the process according to the invention has the advantage of not substantially modifying the mechanical properties of the polymer, during the formation of the composite material.

Finally it makes it possible to eliminate the formulation constraints of the additive-supplemented polymer matrices of the prior art.

The objective of the invention is therefore to provide a conductive composite material obtained from a polymer matrix, which offers a good transverse electrical conductivity when it is in the form of a plate, and also good mechanical properties, while being easy to manufacture.

One subject of the present invention is therefore a process for manufacturing a conductive composite material from a composite polymer matrix, wherein the composite polymer matrix is formed by aggregation of conductive composite particles consisting of particles of a polymer matrix, having a diameter d50 of between 1 and 4000 µm, coated with a layer of electrically conductive material, said particles not being dispersed in a polymer matrix, characterized in that said electrically conductive material consists of at least one metal and in that the ratio of the thickness of said layer to the diameter d50 of the polymer matrix particles, as measured according to the standard ISO 9276, is between 0.0025:100 and 1.5:100, said thickness being less than 300 nm.

Another subject to the invention is the composite material capable of being obtained according to the process above, which advantageously comprises a composite polymer matrix containing a three-dimensional metallic network forming a continuous conductive pathway.

DETAILED DESCRIPTION

The process for manufacturing a composite material according to invention is characterized in that it comprises a step that consists in aggregating conductive composite particles.

These particles may have a spherical, spheroidal or non-spherical shape. The diameter of these particles may be between 1 and 4000 µm, preferably between 5 and 1000 µm, more preferentially between 10 and 500 µm, for example between 30 and 300 µm.

In the context of this description, the term "diameter" is used to describe the diameter of the circumscribed circle of the particles. The D50 corresponds to the value of the particle size which divides the particle population examined exactly into two. In other words, 50% of the particles have a size of less than the D50. The D50 is measured according to the standard ISO 9276—parts 1 to 6: "Representation of results of particle size analysis". In the present description, a laser particle size analyser (for example of Malvern type) is used to obtain the particle size distribution of the powder and to deduce the D50 therefrom.

Moreover, throughout this description, the expression "between" denotes an interval that includes the limits mentioned.

The conductive composite particles used according to the invention consist of a core formed of a polymer matrix, which is coated with a shell of at least one conductive metal. They do not contain any other layer, in particular a layer outside the shell, such as a polymer layer.

The polymer matrix comprises at least one thermoplastic or thermosetting polymer, which may optionally have elastomeric properties, preferably one or more thermoplastic, advantageously non-elastomeric, polymers.

Examples of thermoplastic polymers include homopolymers and copolymers of olefins such as acrylonitrile-butadiene-styrene copolymers, polyethylene, polypropylene, polybutadiene and polybutylene; vinyl polymers such as poly(divinylbenzene) and ethylene/vinyl acetate copolymers; acrylic homopolymers and copolymers and polyalkyl (meth)acrylates such as poly(methyl methacrylate); homopolyamides and copolyamides; polycarbonates; polyesters including poly(ethylene terephthalate) and poly(butylene terephthalate); polyethers such as poly(phenylene ether) and poly(oxymethylene); polystyrene and styrene/acrylonitrile copolymers; styrene/maleic anhydride copolymers; poly(vinyl chloride); fluoropolymers such as poly(vinylidene fluoride), polytetrafluoroethylene and polychlorotrifluoroethylene; thermoplastic polyurethanes; polyetheretherketone (PEEK) and polyetherketoneketone (PEKK); polyetherimide; polysulfone; poly(phenylene sulfide); cellulose acetate; and mixtures thereof.

According to one preferred mode of implementation of the invention, the polymer is chosen from polyamides and polyketones.

The polyamides include homopolyamides and copolyamides.

Among the homopolyamides (PA), mention may especially be made of PA-6, PA-11 and PA-12, obtained by polymerization of an amino acid or a lactam, PA-6.6, PA-4.6, PA-6.10, PA-6.12, PA-6.14, PA 6-18, PA-10.10 and PA-10.12, obtained by polycondensation of a diacid and a diamine, and also aromatic polyamides such as polyarylamides, obtained especially from 1,3-xylylenediamine and/or 1,4-xylylenediamine, and polyphthalamides, obtained from terephthalic and/or isophthalic acid. Some of the aforementioned polymers are in particular available from ARKEMA under the trade name RILSAN.

The copolyamides may be obtained from various starting materials: (i) lactams, (ii) aminocarboxylic acids or (iii) equimolar amounts of diamines and dicarboxylic acids. The formation of a copolyamide requires at least two different starting products to be chosen from those mentioned above. The copolyamide then comprises at least these two moieties. It may thus involve a lactam and an aminocarboxylic acid having a different number of carbon atoms, or two lactams having different molecular weights, or else a lactam combined with an equimolar amount of a diamine and of a dicarboxylic acid. The lactams (i) may in particular be chosen from lauryllactam and/or caprolactam. The aminocarboxylic acid (ii) is advantageously chosen from $\alpha,\omega$-aminocarboxylic acids, such as 11-aminoundecanoic acid or 12-aminododecanoic acid. As regards the precursor (iii), this may in particular be a combination of at least one $C_6$-$C_{36}$, aliphatic, cycloaliphatic or aromatic dicarboxylic acid, such as adipic acid, azelaic acid, sebacic acid, brassylic acid, n-dodecanedioic acid, terephthalic acid, isophthalic acid or 2,6-naphthalene dicarboxylic acid with at least one $C_4$-$C_{22}$, aliphatic, cycloaliphatic, arylaliphatic or aromatic diamine such as hexamethylenediamine, piperazine, 2-methyl-1,5-diaminopentane, m-xylylenediamine or p-xylylenediamine, it being understood that said 11 dicarboxylic acid(s) and diamine(s) are used, when they are present, in equimolar amounts. Such copolyamides are in particular sold under the trade name Platamid® by ARKEMA.

According to one embodiment of the invention, it is possible to choose, as polyamide, a polyamide that is semiaromatic (based on aromatic structure) and/or semicycloaliphatic (based on cycloaliphatic structure), preferably semiaromatic, more particularly corresponding to one of the following formulae:

polyamides comprising x.T units where x is a $C_9$ to $C_{18}$, preferably $C_9$, $C_{10}$, $C_{11}$, $C_{12}$ linear aliphatic diamine and where T is terephthalic acid, chosen from: 8.T, 9.T, 10.T, 11.T, 12.T, 6.T/9.T, 9.T/10.T, 9.T/11.T, 9.T/12.T, 9/6.T, 10/6.T, 11/6.T, 12/6.T, 10/9.T, 10/10.T, 10/11.T, 10/12.T, 11/9.T, 11/10.T, 11/11.T, 11/12.T, 12/9.T, 12/10.T, 12/11.T, 12/12.T, 6.10/6.T, 6.12/6.T, 9.10/6.T, 9.12/6.T, 10.10/6.T, 10.12/6.T, 6.10/9.T, 6.12/9.T, 9.10/9.T, 9.12/9.T, 10.10/9.T 10.12/9.1, 6.10/10.T, 6.12/10.T, 9.10/10.T, 9.12/10.T, 10.10/10.T, 10.12/10.T, 6.10/12.T, 6.12/12.T, 9.10/12.T, 9.12/12.T, 10.10/12.T, 11/6.T/9.T, 11/6.T/10.T, 11/6.T/11.T, 11/6.T/12.T, 11/9.T/10.T, 11/9.T/11.T, 11/9.T/12.T, 11/10.T/11.T, 11/10.T/12.T, 11/11.T/12.T, 6.T/10.T, 6.T/11.T, 6.T/12.T, 10.T/11.T, 10.T/12.T, 11.T/12.T, 12/6.T/10.T, 12/6.T/11.T, 12/6.T/12.T, 12/9.T/10.T, 12/9.T/11.T, 12/9.T/12.T, 12/10.T/11.T, 12/10.T/12.T, 12/11.T/12.T, preceding terpolymer polyamides with 12/ replaced by 9/, 10/, 6.10/, 6.12/, 10.10/, 10.12/, 9.10/ and 9.12/, all the abovementioned polyamides where terephthalic (T) is partially or completely replaced with isophthalic (I), with naphthalene-2,6-dicarboxylic and/or with 1,3- or 1,4-CHDA (cyclohexanedicarboxylic acid), with it being possible for all or some of the aliphatic diamines to be replaced with cycloaliphatic diamines, all the abovementioned polyamides, with replacement of the $C_6$ to $C_{12}$ aliphatic diamine with a cycloaliphatic diamine from BMACM, BACM and/or IPDA and with replacement of all or part of the aromatic diacid T with a linear or branched $C_6$ to $C_{18}$ aliphatic diacid.

In one advantageous embodiment of the invention, use is made, as thermoplastic polymer, of a semicrystalline polyamide having a glass transition temperature of at least 100° C., preferably of at least 120° C. and a melting point below 280° C., these temperatures being measured by DSC according to the standard ISO 11357. This polyamide preferably has the general formula 10.T/A.T where T denotes terephthalic acid and A denotes for example m-xylenediamine (MXDA) or 2-methylpentamethylenediamine (MPMDA). This polyamide may be obtained from a reactive composition of at least one prepolymer, which is a precursor of said polyamide, bearing two terminal functions (typically $NH_2$ and COOH) that are co-reactive with one another by condensation, or two identical terminal functions (typically $NH_2$ or COOH) capable of reacting with the terminal functions borne by another prepolymer that is mixed therewith (typically COOH or $NH_2$). As a variant, said polyamide may be obtained by mixing said precursors in the presence of a monomeric chain extender bearing two terminal functions of oxazoline, epoxy or isocyanate type.

As thermosetting polymers, use may in particular be made of epoxy resins, unsaturated polyesters, phenolic resins, melamine-formaldehyde resins and polyimides, as long as they are in solid form at ambient temperature (25° C.). Epoxy resins are preferred for use in this invention.

Besides the above polymers, the polymer matrix used according to the invention may further optionally contain one or more additives chosen from: electrically conductive fillers, curing agents, plasticizers, lubricants, pigments, dyes, UV stabilizers, antioxidants and/or heat stabilizers, impact modifiers, reinforcing fillers, antistatic agents, fungicides, flame retardants and mixtures thereof. According to one preferred method of implementation of the invention, it contains expanded graphite which is intended to improve its thermal conductivity. The reinforcing fillers are particulate materials in the form of inclusions or fibers, which are intended to improve the properties of the matrix. Ceramic, organic, inorganic and metal fibers and also carbon nanotubes constitute examples of such materials. It is preferred according to the invention for the polymer matrix to contain one or more electrically conductive fillers, such as graphite.

As indicated above, the particles used according to the invention are coated with a layer of metallic conductive material.

Examples of metals that can be used in the present invention include silver, gold, nickel, copper, platinum, tin, titanium, cobalt, zinc, iron, chromium, aluminum, and also alloys thereof, preferably gold, silver, nickel, copper, platinum, tin and titanium and more preferentially silver.

The application of the metallic coating to the polymer particles may be carried out by various methods such as physical vapor deposition (PVD), chemical vapor deposition (CVD) and autocatalytic deposition (electroless plating). It is preferred in this invention for the conductive composite particles to be obtained by vapor deposition of at least one metal on the surface of the polymer matrix particles. In the CVD process, an organometallic compound may be heated in order to pass into the vapor state, then entrained in a fluidized bed reactor containing polymer particles, so as to break down the organometallic precursor and deposit the metal on the polymer particles. The treatment temperature and time, and also the amount of precursor, make it possible to control the thickness of the deposit. In the PVD process, a metallic precursor of the metal to be deposited may be evaporated by electron bombardment, Joule effect, induction, electric arc or ion beam. As a variant, the metal may be deposited by vacuum sputtering or by ion deposition. A person skilled in the art will know how to adjust the parameters of these processes in order to obtain a metallic layer having the desired thickness. It is preferred in this invention to make use of a CVD process.

The amount of metal deposited on the polymer matrix particles may represent from 1% to 25% by weight, preferably from 5% to 20% by weight, relative to the total weight of the particles, as long as the metallic layer has a thickness of less than 300 nm, measured for example with the aid of an electron microscope after ion polishing, according to a technique well known to a person skilled in the art, and as long as the ratio of the thickness of said layer to the diameter d50 of the polymer matrix particles, measured according to the standard ISO 9276, is between 0.0025:100 and 1.5:100, preferably between 0.005:100 and 1:100 and, better still, between 0.1:100 and 0.5:100.

In the process according to invention, the composite particles described above are aggregated, preferably by bringing said particles into contact under low shear conditions, at a temperature at which the polymer matrix is at least partially molten, so as to make said particles coalesce. Thus a composite polymer matrix is obtained that contains a three-dimensional metallic network forming a continuous conductive pathway.

Thus, it is preferred not to use processes of compounding, injection molding or extrusion of the composite particles, which generate too high a shear of the powder.

This aggregation step may on the other hand be carried out by any process of additive manufacturing of parts from powder, and in particular by laser sintering (SLS) or mask sintering (SMS) or by compression molding of the particles in order to form a composite material. This composite material may be directly obtained in the desired shape or, on condition that the polymer matrix comprises a thermoplastic polymer, it can be melted and reshaped subsequently.

Alternatively, the process according to the invention may comprise a step of coating a substrate with the composite particles described above, which is carried out before or at the same time as the aggregation step. The substrate is advantageously a fibrous substrate, which may be formed from natural or synthetic fibers such as glass fibers, carbon fibers, metallized polymer fibers and mixtures thereof. These fibers may be nonwoven or woven, braided or knitted in any way and may be in the form of a roving, cord, sheet or tape, for example. In the present invention, it is preferred for the substrate to consist of a sheet of carbon fibers. According to one method of implementation, the coating and aggregation steps may be carried out simultaneously by fluidized bed dip-coating. In this case, the substrate is brought to a temperature above the melting point of the polymer forming the core of the particles, before the latter are applied to its surface. According to another method of implementation, the coating step may be a step of dry impregnation of the substrate, in particular by electrostatic spraying, and the aggregation step may then comprise the heat treatment of the impregnated substrate, for example by means of infrared heating or a convection oven.

In the above variant, the composite material obtained constitutes a preimpregnated substrate that may be shaped according to various techniques. In particular, when it is in the form of a plate, it may be consolidated by calendering, for example. As a variant, when it is in the form of composite fibers, these fibers may be converted into rotational parts by filament winding or into profiled elements by pultrusion. Another shaping process that may be carried out is the fiber or tape placement process. The devices that enable the implementation of these processes may include coating and heating (aggregation) means that make it possible to carry out all the steps of the process according to the invention.

It is preferred for the preimpregnated substrate to consist of a ply consisting of the fibrous substrate covered, generally on both its faces, with the composite material according to the invention. Several of these plies may be superimposed on a former (mold) in order to form a laminate that is then stoved. In the case where the conductive composite particles contain a thermosetting resin, this laminate is then generally heated and compressed in order to cure the resin.

At the end of these steps of optional coating, aggregation and generally shaping, a composite material according to the invention is obtained.

This may in particular be used in any application requiring a high electrical conductivity and in particular to improve the electromagnetic shielding and/or the electrostatic protection of electronic components, and also to impart lightning protection to aeronautical parts, wind turbines, buildings, motor vehicles, trains or boats. In the aeronautical field, the composite material according to invention may in particular be used for the manufacture of fuselages, wings, ailerons, flaps, cowlings, ventral beams, air intakes, radomes or fairings.

EXAMPLES

The invention will be better understood in light of the following examples, which are given purely by way of illustration and do not have the objective of limiting the scope of the invention, defined by the appended claims.

Example 1: Manufacture of a Composite Film

Particles of polyamide 11 (Rilsan® PA11 supplied by ARKEMA) coated with a layer of silver representing from 8% to 10% by weight, relative to the total weight of the particles were obtained by CVD. These composite particles had a diameter D50 of 100 µm, as measured by laser particle size analysis. The thickness of the metallic coating was around 150 nm.

These particles were applied by fluidized bed dip-coating to a siliconized steel plate brought to 330°. The film obtained had a thickness of 300 µm. It was detached from the plate then analyzed with a scanning electron microscope. A good coalescence of the particles and the presence of a continuous metallic network within the material were observed.

The electrical resistance of the film was then measured by means of the so-called 4-point method, which consists in plotting the curve of the voltage measured as a function of the intensity applied to the sample, for four different intensity values. The slope of the straight-line obtained corresponds to the surface electrical resistance of the film, which in this example was 4 ohm. Its volume resistivity was 200 ohm-cm.

Example 2 (Comparative): Manufacture of a Composite Film

Composite films were prepared as described in Example 1, except that the weight fraction of silver was 15-20% instead of 8-10%. The particles obtained were coated with a layer of silver having a thickness of 300 to 400 nm.

These films were brittle and had a rough and porous appearance. Observation thereof with a scanning electron microscope revealed a mediocre coalescence of the grains, which further appeared mixed with metal debris.

Example 3: Manufacture of a Composite Plate

Four carbon fiber reinforcements (Hexcel plain 3K HS at 200 g/m$^2$) with a width of 195 mm and a length of 295 mm were impregnated by dusting both their faces with a powder of PA11 particles as described in Example 1. After stacking the four plies thus obtained and application of an adhesive to the 4 sides of the stack, the latter was thermocompressed. To achieve this, it was placed in a 200 mm wide and 300 mm long mold, covered with a sheet of Teflon-coated fabric on each face, then the mold was introduced into a Carver press, the platens of which were preheated to 290° C., the pressure applied to the plies being 1.7 bar. Next, the temperature of the platens was lowered to 250° C. then, after 30 sec, the pressure was brought to 10 bar. After 15 min, the platens were cooled to a temperature of around 100° C. After removal from the mold, a composite plate was obtained.

The volume resistivity of these plates, measured by the so-called four-point method, was around 3000 ohm-cm.

The invention claimed is:

1. A process for manufacturing a conductive composite material consisting of:
   (a) coating particles of a polymer matrix, having a diameter (d50) of between 1 and 4000 µm, with a layer of an electrically conductive material having a thickness of less than 300 nm where the layer consists of at least one metal to form a plurality of conductive composite particles, where the ratio of the thickness of the metal layer to the diameter (d50) of the polymer matrix particles is 0.1:100 to 0.5:100 and the conductive composite particles are not dispersed in a second polymer matrix; and
   (b) aggregating the plurality of conductive composite particles to form a composite polymer matrix, wherein aggregating the conductive composite particles is carried out by bringing said conductive composite particles into contact under low shear conditions at a temperature at which the polymer matrix of the conductive composite particles is at least partially molten and coalescing the conductive composite particles.

2. The process according to claim 1, wherein aggregating the conductive composite particles is achieved using laser sintering, mask sintering, or compression molding of the conductive composite particles.

3. The process according to claim 1, wherein the substrate is coated with the conductive composite particles before or at the same time as the aggregation step to form an impregnated substrate.

4. The process according to claim 1, wherein coating and aggregating are carried out simultaneously by dip-coating in a fluidized bed.

5. The process according to claim 1, wherein coating comprises dry impregnating the substrate with the conductive composite particles and aggregating comprises heat treating the impregnated substrate.

6. The process according to claim 1, wherein the polymer matrix comprises one or more thermoplastic polymers.

7. The process according to claim 1, wherein coating particles of a polymer matrix comprises vapor depositing of at least one metal on the surface of said particles of a polymer matrix.

8. A process for manufacturing a conductive composite material consisting of:
   (a) coating particles of a polymer matrix, having a diameter (d50) of between 1 and 4000 μm, with a layer of an electrically conductive material having a thickness of less than 300 nm where the layer consists of at least one metal to form a plurality of conductive composite particles, where the ratio of the thickness of the metal layer to the diameter (d50) of the polymer matrix particles is 0.1:100 to 0.5:100 and the conductive composite particles are not dispersed in a second polymer matrix;
   (b) aggregating the plurality of conductive composite particles to form a composite polymer matrix, wherein aggregating the conductive composite particles is carried out by bringing said conductive composite particles into contact under low shear conditions at a temperature at which the polymer matrix of the conductive composite particles is at least partially molten and coalescing the conductive composite particles; and
   (c) shaping the composite polymer matrix after step (b), so as to form a conductive composite material in the form of a film in which said composite polymer matrix contains a three-dimensional metallic network forming a continuous conductive pathway.

9. A process for manufacturing a conductive composite material consisting of:
   (a) coating particles of a polymer matrix, having a diameter (d50) of between 1 and 4000 μm, with a layer of an electrically conductive material having a thickness of less than 300 nm where the layer consists of at least one metal to form a plurality of conductive composite particles, where the ratio of the thickness of the metal layer to the diameter (d50) of the polymer matrix particles is 0.1:100 to 0.5:100 and the conductive composite particles are not dispersed in a second polymer matrix;
   (b) aggregating the plurality of conductive composite particles to form a composite polymer matrix, wherein aggregating the conductive composite particles is carried out by bringing said conductive composite particles into contact under low shear conditions at a temperature at which the polymer matrix of the conductive composite particles is at least partially molten and coalescing the conductive composite particles; and
   (c) coating a substrate with the conductive composite particles before or at the same time as the aggregating, so as to form a conductive composite material in the form of a film in which said composite polymer matrix contains a three-dimensional metallic network forming a continuous conductive pathway.

* * * * *